United States Patent [19]

Kobari

[11] Patent Number: 4,767,892
[45] Date of Patent: Aug. 30, 1988

[54] PRINTED-WIRING BOARD
[75] Inventor: Tadaomi Kobari, Iwaki, Japan
[73] Assignee: Alpine Electronics Inc., Japan
[21] Appl. No.: 12,945
[22] Filed: Feb. 10, 1987
[30] Foreign Application Priority Data May 16, 1986 [JP] Japan .............................. 61-73828[U]

[51] Int. Cl.⁴ .............................................. H05K 1/00
[52] U.S. Cl. ..................................... 174/68.5; 29/846; 361/403
[58] Field of Search ................ 174/68.5; 361/401, 402, 361/403, 397; 29/846

[56] References Cited

U.S. PATENT DOCUMENTS 4,088,828  5/1978  Yamamoto et al. ............... 174/68.5
4,220,810  9/1980  Arai et al. ........................... 174/68.5
4,389,771  6/1983  Cassidy et al. ................. 174/68.5 X

FOREIGN PATENT DOCUMENTS 1187282  2/1965  Fed. Rep. of Germany ..... 174/68.5
2080629  2/1982  United Kingdom ............... 174/68.5

Primary Examiner—Morris H. Nimmo
Attorney, Agent, or Firm—Guy W. Shoup; Leighton K. Chong; Paul J. Winters

[57] ABSTRACT

A printed wiring board is made up of an insulating board and a conductor pattern, which has a plurality of lands, disposed on the insulating board and provided with a solder-resist layer formed on the conductor pattern excluding the lands. Solder-resist barriers are disposed on the solder-resist layer in between the lands with the top surface thereof built to a higher level than the surface level of the lands for effectively preventing formation of a solder bridge between adjoining lands.

5 Claims, 1 Drawing Sheet

4,767,892

PRINTED-WIRING BOARD

BACKGROUND OF THE INVENTION

1. Field of the Invention

The present invention relates to a printed-wiring board and more particularly to a printed-wiring board provided with solder-resist barriers, the top surface level thereof being higher than the surface level of lands, disposed on a solder-resist layer formed on the conductor pattern.

2. Description of the Prior Art

A selective soldering type printed-wiring board is fabricated by arranging a conductor pattern of copper foil circuits on an insulating board and forming a solder-resist layer on the copper foil circuits excluding the lands belonging to the conductor pattern. Such a solder-resist layer is shown in a schematic sectional view of FIG. 2, wherein liquid resin is spread over a conductor pattern 2 arranged on an insulating board 1 excluding lands 21, 21 . . . and forms a solder-resist layer 3. Since the printed-wiring board provided with the solder-resist layer 3 thereon has the lands 21, 21 . . . of a required minimum area, there are such advantages that the board does not become stained with solder, the adhesive strength of the copper foil circuit is not lowered by heat, and the consumption of solder can be saved. On the other hand, since the solder-resist layer 3 is frequently formed at a level lower than that of the upper side of the lands 21, 21 . . . , there is a disadvantage that a solder bridge (short circuit) is liable to be produced between circuits. Therefore, it is practiced to dispose protruding members 4, 4 . . . on the top surface of the solder-resist layer 3 by such a method as silk screen printing. However, since the setting speed of the silk ink is not fast enough, the protruding members 4, 4 . . . provided by such a method as silk screen printing tend to spread out with time, and so, the same are frequently built at a lower level than that of the lands 21, 21 . . . .

While the lands 21, 21 . . . made of copper foil has, for example, a thickness of approximately 35 $\mu$m, the solder-resist layer 3 is 12–15 $\mu$m thick. Since the height of the protruding members 4, 4 . . . formed of the liquid silk ink becomes 12–15 $\mu$m, the sum of the height of the solder-resist layer 3 and that of the protruding member 4, i.e., the height of the top portion of the protruding member 4, is held below that of the land 21. Therefore, it has not been possible to effectively prevent the occurrence of the solder bridging between adjoining lands.

SUMMARY OF THE INVENTION

It is accordingly an object of this invention to provide a printed-wiring board overcoming the above described disadvantage. According to the present invention, solder-resist barriers—a second solder-resist layer, as it were—formed of quick-set liquid silk ink are disposed on the solder-resist layer. Namely, by the use of the quick-set liquid silk ink, it is enabled to provide the solder-resist barriers at a desired height, without its spreading out with time. And therefore, the top surface of the same can be brought to a higher level than that of the lands and formation of a solder bridge between adjoining lands can be effectively prevented.

DESCRIPTION OF THE PREFERRED EMBODIMENT

Figure 1:
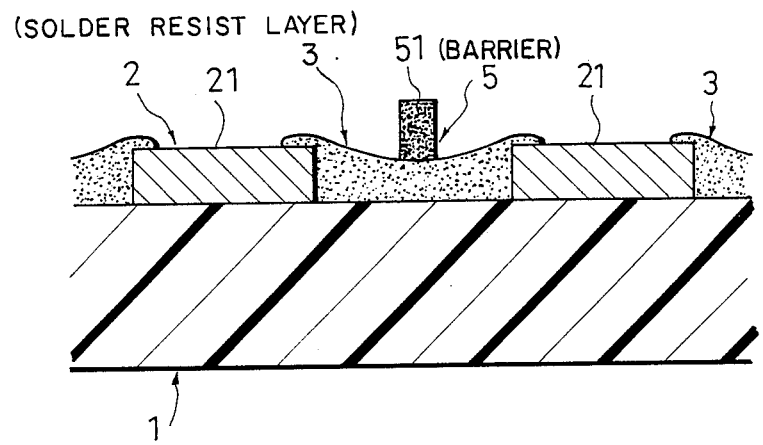
FIG. 1 is a schematic sectional view showing a printed-wiring board according to the present invention.
Figure 2:
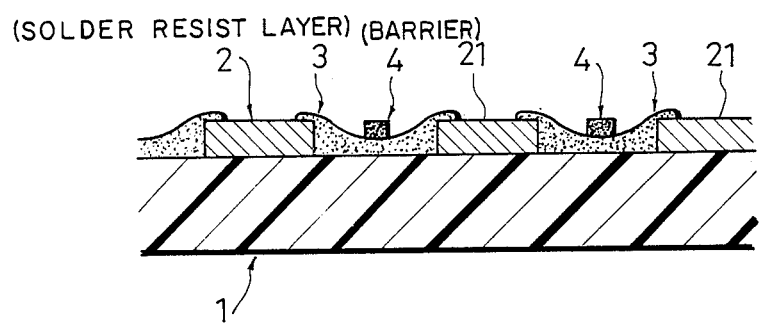
FIG. 2 is a schematic sectional view showing a conventional printed-wiring board.

An embodiment of the printed-wiring board of the present invention will be described below in detail with reference to the accompanying drawing.

Like component parts to those in the conventional example will be denoted by like reference numerals in the following description.

FIG. 1 is a schematic sectional view showing a printed-wiring board according to the present invention. The printed-wiring board is made up of an insulating board 1 of a laminated plate formed by laminating base paper sheets by phenolic resin or the like and a conductor pattern 2 formed of copper foil circuits disposed on the insulating board 1. The conductor pattern 2 is provided with a necessary number of lands 21, 21 . . . .

To adapt such a printed-wiring board to selective soldering use, a solder-resist layer 3 is formed thereon by applying resin onto the conductor pattern 2 excluding the lands 21, 21 . . . . Barriers 5 are provided on the solder-resist layer 3 in between each of the lands 21 and the adjoining lands 21 thereto. The barriers 5 are formed by silk screen printing. That is, a screen (not shown) is arranged in a predetermined position on the solder-resist layer 3 and printing is carried out by having a suitable amount of liquid silk ink squeezed through the screen. Liquid silk ink having high viscosity and quick setting property is used. For example, liquid silk ink of the UV hardened type is commercially available and may be used. Therefore, the liquid silk ink squeezed through portions for printing straight lines provided in the screen immediately sets without spreading out, whereby the barriers 5 having the top surface 51 can be built to a predetermined height. Since, in general, the barrier 5 can be provided so as to achieve a height of 28–85 $\mu$m, if the thickness of the solder-resist layer 3 is 12–15 $\mu$m, the top surface 51 of the barrier 5 reaches the height between 40 and 100 $\mu$m above the surface of the insulating board 1, and thus, occupies a very high level compared with the height of the land 21 (35 $\mu$m).

Incidentally, good printing is achieved in the silk screen printing even if the upper side of the solder-resist layer 3 is rough or curved because the ink adapts itself to the surface. The barriers 5 themselves can be variously colored and, further, formed into characters or symbols for the purpose of marking, and the fitting positions of resistors, capacitors, and other electronic parts can thereby be clearly indicated.

The printed-wiring board of the present invention as described so far is arranged such that the barriers—the second solder-resist layer, as it were—are disposed on the solder-resist layer in between the lands and the top surface of the barrier is built to a higher level than the surface level of the land, and therefore, when connecting parts to the board in practice, a solder bridge is not produced between adjoining lands.

Thus, formation of the solder bridge between adjoining lands at the time of parts connection can be prevented for certain because the solder resist barriers are provided at a higher level than the surface level of the land. Since the solder-resist barriers themselves are formed by screen printing using quick-set silk ink, the shape keeping quality of the solder-resist barriers is very high, hence the bridge preventing effect is reliably provided. Further, by arranging the barriers themselves to represent such markings as symbols and characters, the connecting work of the various electronic parts can be made very easy and highly reliable.

What is claimed is:

1. In a printed-wiring board made up of an insulating board, a conductor pattern formed on a surface thereof including a plurality of lands having a certain height above the surface of the insulating board, and a solder-resist layer made of resin formed on the conductor pattern except for the lands, so that solder can be selectively applied on the lands, the improvement comprising protruding barriers formed, as a second solder-resist layer, by quick-setting, silk ink screen printed on the first-mentioned solder-resist layer in between adjacent lands, wherein said protruding barriers are built to a height at a substantially higher level of 5–65 $\mu$m higher than the height of the lands and with a thickness substantially greater than that of the first mentioned layer so as to prevent solder bridging between the adjacent lands.

2. A printed-wiring board according to claim 1, wherein the height of the lands is approximately 35 $\mu$m, and the protruding barriers have a height of approximately 40 to 100 $\mu$m above the surface of the insulating board.

3. In a method of forming a printed-wiring board made up of an insulating board, a conductor pattern formed thereon including a plurality of lands having a certain height above the surface of the insulating board, and a solder-resist layer made of resin formed on the conductor pattern except for the lands, so that solder can be applied on the lands, the improvement comprising the step of forming protruding barriers, as a second solder-resist layer, by silk screen printing with a high viscosity, quick-setting silk ink on the first-mentioned solder-resist layer in between adjacent lands, so that said protruding barriers are built to a height at a substantially higher level of 5–65 $\mu$m higher than the height of the lands and with a thickness substantially greater than that of the first mentioned layer so as to prevent solder bridging between the adjacent lands.

4. A method of forming a printed-wiring board according to claim 3, wherein the height of the lands is approximately 35 $\mu$m, and the protruding barriers have a height of approximately 40 to 100 $\mu$m above the surface of the insulating board.

5. A printed-wiring board formed according to the method of claim 3.

* * * * *